United States Patent
Chuang et al.

(10) Patent No.: US 9,865,716 B2
(45) Date of Patent: Jan. 9, 2018

(54) SYSTEM AND METHOD FOR A VERTICAL TUNNELING FIELD-EFFECT TRANSISTOR CELL

(75) Inventors: Harry Hak-Lay Chuang, Singapore (SG); Ming Zhu, Singapore (SG)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 149 days.

(21) Appl. No.: 13/594,289

(22) Filed: Aug. 24, 2012

(65) Prior Publication Data

US 2014/0054711 A1   Feb. 27, 2014

(51) Int. Cl.
| | | |
|---|---|---|
| H01L 29/788 | (2006.01) | |
| H01L 29/739 | (2006.01) | |
| H01L 21/8234 | (2006.01) | |
| H01L 29/423 | (2006.01) | |
| H01L 29/06 | (2006.01) | |
| H01L 21/8238 | (2006.01) | |
| H01L 27/092 | (2006.01) | |

(52) U.S. Cl.
CPC .. *H01L 29/7391* (2013.01); *H01L 21/823418* (2013.01); *H01L 21/823885* (2013.01); *H01L 27/092* (2013.01); *H01L 29/0657* (2013.01); *H01L 29/4238* (2013.01); *H01L 29/42356* (2013.01); *H01L 29/7889* (2013.01)

(58) Field of Classification Search
CPC .................. H01L 29/7851; H01L 21/8232
See application file for complete search history.

(56) References Cited

U.S. PATENT DOCUMENTS

| 4,670,768 | A * | 6/1987 | Sunami et al. ............... 257/331 |
| 5,990,509 | A * | 11/1999 | Burns, Jr. ......... H01L 27/10808 |
| | | | 257/296 |
| 8,241,976 | B2 * | 8/2012 | Masuoka et al. ............. 438/212 |
| 8,319,293 | B2 * | 11/2012 | Masuoka et al. ............. 257/396 |
| 2005/0106789 | A1 * | 5/2005 | Gottsche ........... H01L 21/28123 |
| | | | 438/163 |
| 2007/0052012 | A1 * | 3/2007 | Forbes .......................... 257/328 |
| 2007/0148939 | A1 | 6/2007 | Chu |

(Continued)

FOREIGN PATENT DOCUMENTS

| CN | 101866857 | 10/2010 |
| CN | 101847636 | 12/2010 |

(Continued)

OTHER PUBLICATIONS

Endoh et al, IEDM 01-33 "Novel Ultra High Density . . . Cell" 2001 IEEE.*

(Continued)

*Primary Examiner* — Cheung Lee
(74) *Attorney, Agent, or Firm* — Haynes and Boone, LLP (57) ABSTRACT

A semiconductor device cell is disclosed. The semiconductor device cell includes a transistor gate having a gating surface and a contacting surface and a source region contacted by a source contact. The semiconductor device cell further includes a drain region contacted by a drain contact, wherein the drain contact is not situated opposite the source contact with respect to the gating surface of the transistor gate. Additional semiconductor device cells in which the gate contact is closer to the source contact than to the drain contact are disclosed.

20 Claims, 5 Drawing Sheets

(56) References Cited

U.S. PATENT DOCUMENTS

2011/0018056 A1* 1/2011 Takeuchi .......... H01L 21/76895
257/329
2013/0320427 A1 12/2013 Loh

FOREIGN PATENT DOCUMENTS

CN 101933149 12/2010
CN 102272933 12/2011

OTHER PUBLICATIONS

Chinese Office Action issued in Chinese Patent Application No. 201210546494.4 dated May 9, 2016.
Chinese Office Action issued in Chinese Patent Application No. 201210546494.4 dated Sep. 13, 2016.

* cited by examiner

SYSTEM AND METHOD FOR A VERTICAL TUNNELING FIELD-EFFECT TRANSISTOR CELL

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

However, as the size of the smallest component has decreased, numerous problems have increased. As features become closer, current leakage can become more noticeable, signals can crossover more easily, and power usage has become a significant concern. The semiconductor integrated circuit industry has produced numerous developments in effort to continue the process of scaling. One of these developments is the potential replacement or supplementation of the conventional MOS field effect transistor by the tunneling field effect transistor (TFET).

TFETs are promising devices that may enable further scaling of power supply voltage without substantially increasing off-state leakage currents due to its sub-60 mV/dec subthreshold swing. However, existing TFETs have not been satisfactory in every respect.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

The various features disclosed in the drawings briefly described above will become more apparent to one of skill in the art upon reading the detailed description below. Where features depicted in the various figures are common between two or more figures, the same identifying numerals have been used for clarity of description.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity.

Figure 1A:
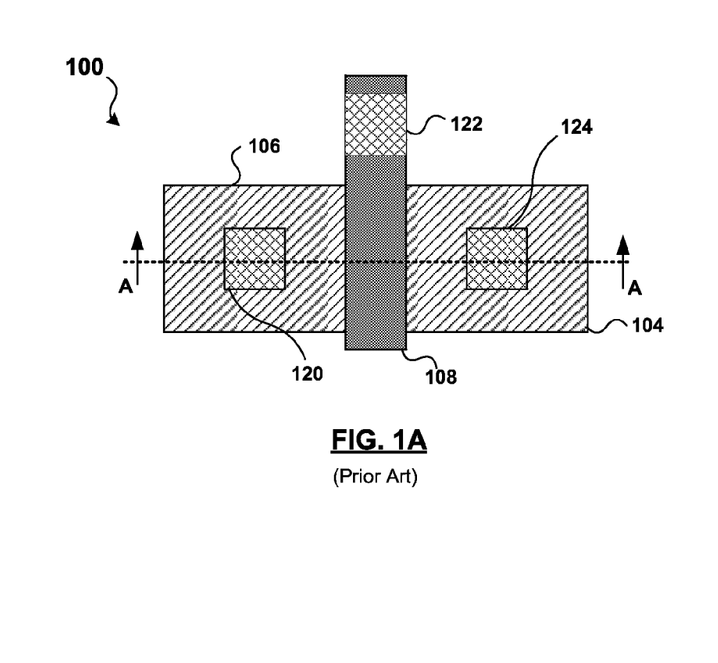
FIGS. 1A and 1B present a top, schematic view and a cross-sectional diagram of a MOS transistor, respectively.
Figure 1B:
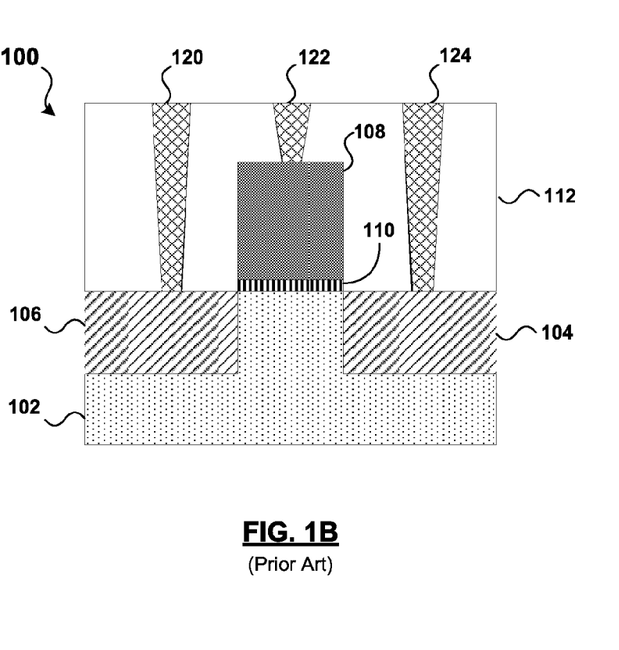

FIGS. 1A and 1B depict a metal-oxide-semiconductor (MOS) field-effect transistor (FET) 100. MOSFET 100 includes a substrate 102, which in this example, is a silicon substrate. Oppositely charged dopants have been implanted to create a drain region 104 and a source region 106. A transistor gate 108 is situated above a gate oxide 110. MOSFET 100 further includes an insulating layer 112, which in this example, is an inter-metal dielectric layer made of silicon oxide. FIGS. 1A and 1B both depict three contacts: source contact 120, gate contact 122, and drain contact 124. Contacts 120, 122, and 124 have been formed by etching holes through insulating layer 112, and then filling the holes with a conductor, such as tungsten. Contacts 120, 122, and 124 provide access by remote electrical signals and voltages to drain region 104, source region 106, and transistor gate 108. FIG. 1B is a cross-sectional diagram largely along the reference line A in FIG. 1A. However, as readily observed in FIG. 1A, gate contact 122 is not positioned or arranged along reference line A. However, gate contact 122 is included in FIG. 1B, for clarity and comparison purposes.

Figure 2A:
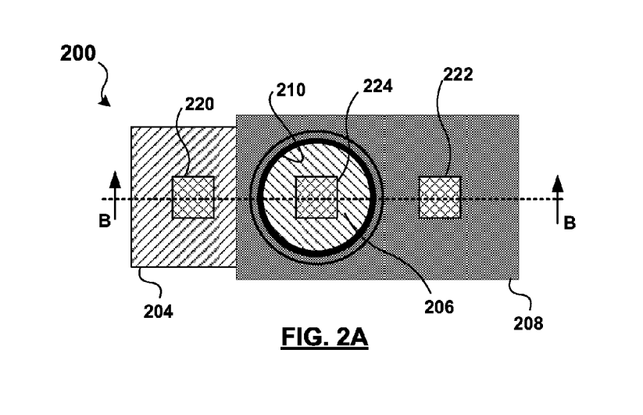
FIGS. 2A and 2B present a top, schematic view of an N-type semiconductor device and a cross-sectional diagram of the N-type semiconductor device according to one embodiment.
Figure 2B:
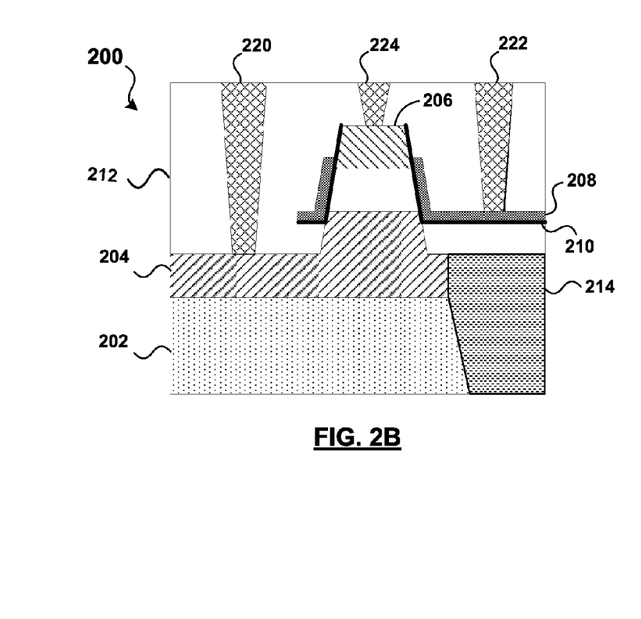

FIG. 2A and FIG. 2B depict an exemplary embodiment that is an N-type tunneling FET (TFET). FIG. 2A shows a schematic, top view of a vertically arranged TFET 200, while FIG. 2B is a cross-sectional diagram along FIG. 2A's reference line B. FIG. 2B includes a substrate 202. In this example, substrate 202 is a silicon substrate. However, in other embodiments, substrate 202 may be another suitable elementary semiconductor material, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. TFET 200 further includes a drain region 204, a source region 206, and a transistor gate 208. In the depicted embodiment, the source region 206 is formed at the top of a frustoconical protrusion, which protrudes out of the plane of substrate 202 and is made of the same material as substrate 202. The frustoconical protrusion may be formed by subjecting substrate 202 to an etch process, with a hard masking layer on the surface of substrate 202. By having a masking layer approximately the size of the top of the source region 206, the frustoconical protrusion can be formed with sidewalls forming an angle with the planar surface of the substrate ranging from approximately 90 degrees to around 45 degrees. In such an embodiment, the masking layer that creates the protrusion is circular in shape. However, other masking layer shapes may be used in other embodiments.

N-type dopants such as phosphorous or arsenic may be implanted to create drain region 204. In the depicted embodiment, a diffusion process has been applied to cause phosphorous dopants to rise up into the frustoconical protrusion. As depicted, the diffusion process is used to bring the dopants up above the lower edge of transistor gate 208. P-type dopants may be implanted into the top of the frustoconical protrusion to create a frustoconical source region 206. In this example, boron is implanted to form source region 206, however other embodiments may use other P-type dopants as known to those of skill in the art.

Transistor gate 208 may be a conductive multilayered gate. As depicted, transistor gate 208 is a single, doped polysilicon layer. In other embodiments, transistor gate 208 may be a metal layer such as copper, or a combination of a metal layer and a polysilicon layer. In this example, transistor gate 208 includes a planar portion, which is parallel to the surface of substrate 202, and a gating surface, which surrounds the frustoconical protrusion. The out-of-plane gating surface of transistor gate 208 overlaps the portion of the drain that is raised up within the frustoconical protrusion at the bottom and the source region at the top with a channel of intrinsic substrate material in between. A dielectric layer 210 has been deposited before the material that forms transistor gate 208, so that dielectric layer 210 is in between the frustoconical protrusion and transistor gate 208. In the depicted embodiment, dielectric layer 210 includes an oxide interfacial layer and a high dielectric constant (high-k) material layer made of HfO. In other embodiments, the interfacial layer may be another insulating material layer. In additional embodiments, dielectric layer 210 may be formed from many different materials, including NiO, TiO, HfO, ZrO, ZnO, $WO_3$, $Al_2O_3$, TaO, MoO, and CuO, and high-k materials such as $TiO_2$, $Ta_2O_5$, $Y_2O_3$, $La_2O_5$, and $HfO_2$.

Additionally, a shallow trench isolation feature (STI) 214 is depicted as located underneath the planar portion of transistor gate 208. STI 214 may be formed by etching a trench in substrate 214 and then filling the trench with an electrically insulating material. The embodiment depicted is an oxide STI 214, situated directly below the planar portion of transistor gate 208. Some embodiments may not include an STI 214, or may not include STI 214 beneath the planar portion of transistor gate 208. Positioning the STI 214 underneath the planar portion of transistor gate 208 may decrease the effective footprint of TFET 200 on the substrate.

An oxide layer 212 covers the surface of substrate 202 and electrically insulates the frustoconical protrusion and the transistor gate 208. A portion of oxide 212 is situated between STI 214 and transistor gate 208. In order to make electrical contact for operation and use, TFET 200 includes a drain contact 220, a gate contact 222, and a source contact 224. These three contacts may be formed by first etching holes through oxide layer 212, and then filling the holes with a conductive material. In the depicted embodiment, drain contact 220, gate contact 222, and source contact 224 are tungsten contacts.

As shown in FIG. 2B, drain contact 220, gate contact 222, and source contact 224 are arranged in a co-linear arrangement, unlike the traditional MOSFET depicted in FIG. 1A. Thus, unlike FIGS. 1A and 1B, FIG. 2B represents a reasonably accurate cross-section of FIG. 2A along reference line B. Thus, the embodiment depicted in FIG. 2B has drain contact 220, gate contact 222, and source contact 224 arranged along reference line B.

Figure 3A:
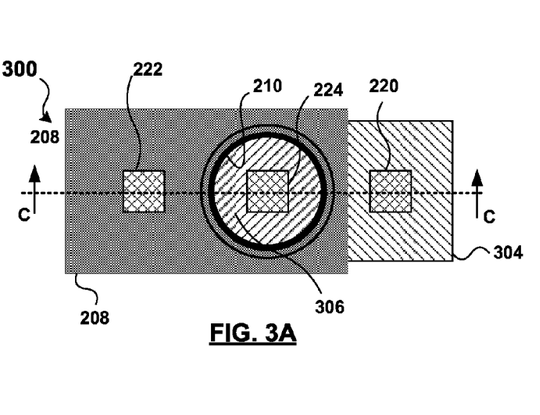
FIGS. 3A and 3B present a top, schematic view of a P-type semiconductor device and a cross-sectional diagram of the P-type semiconductor device according to another embodiment.
Figure 3B:
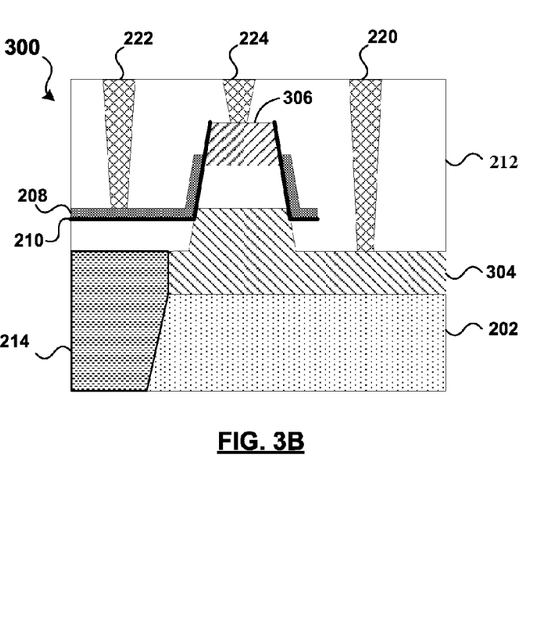

FIG. 3B is a P-type embodiment of a TFET 300. Many aspects of TFET 200 are shared with TFET 200, and so much of the disclosure above is applicable here as well. Thus, TFET 300 includes a substrate 202, a drain region 304, a source region 306, and a transistor gate 208. While transistor gate 208 and substrate 202 may be substantially as described above, drain region 304 is a P-type drain region. In the depicted example, drain region 304 has been doped with boron, while other embodiments may include different P-type dopants. Analogously, N-type source region 306 contains phosphorous, but in other embodiments may include arsenic or other N-type dopants.

TFET 300 also includes a dielectric layer 210 between transistor gate 208 and the frustoconical protrusion and an STI 214 underneath the planar portion of transistor gate 208. A drain contact 220, a gate contact 222, and a source contact 224 allow electrical signals and voltages to access the various features of TFET 300 through an oxide layer 212.

Figure 4A:
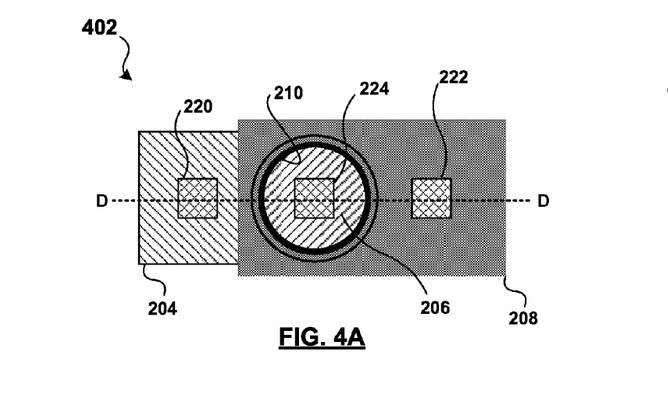
FIGS. 4A-C depicts a number of basic configurations of the semiconductor device according to various embodiments.
Figure 4B:
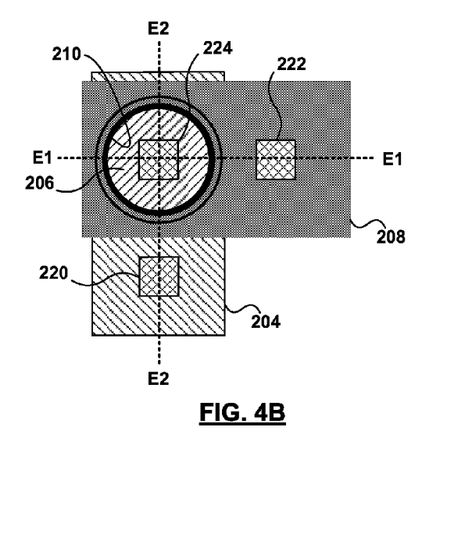
Figure 4C:
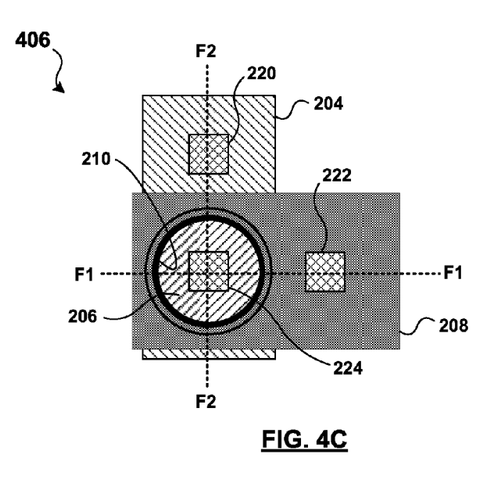

FIGS. 4A-C contain several schematic, top view diagrams of TFETs according to various embodiments that highlight some of the flexibility of layouts encompassed by the various embodiments. Referring to FIG. 4A, TFET 402 is substantially similar to TFET 200 as depicted in FIG. 2A. Thus, TFET 402 depicts drain contact 220, source contact 224, and gate contact 222 as being arranged in a substantially linear arrangement, along reference line D, with drain contact 220 and gate contact 222 as being on opposite sides of the gating surface of transistor gate 208 and source contact 224.

Referring to FIG. 4B, TFET 404 is an alternative embodiment of an N-type TFET like TFET 402. However, the contacts of TFET 404 are arranged or laid out differently than those of TFET 402. While source contact 224 and gate contact 222 are arranged co-linearly along reference line E1, but drain contact 220 does not lay on reference line E1. Instead, drain contact 220 and source contact 224 are arranged along reference line E2 that is perpendicular to the reference line E1. Thus, a 90 degree angle can be visualized between drain contact 220, source contact 224, and gate contact 222.

Referring to FIG. 4C, TFET 406 is yet another alternative embodiment of an N-type TFET like TFET 402. Similarly to TFET 404, not all of contacts 220, 222, and 224 are arranged co-linearly. As depicted, source contact 224 and gate contact 222 are arranged linearly along reference line F1, while drain contact 220 and source contact 224 are arranged along reference line F2 that is perpendicular to the reference line F1.

Embodiments similar to but different from those depicted by TFETs 402, 404, and 406 are within the scope of this disclosure. For instance, TFETs 402, 404, and 406 may be P-type, rather than N-type, embodiments. Additionally, the angle that can be visualized by the arrangement of drain contact 220, source contact 224 at the vertex, and gate contact 222 can be any angle. This may allow a circuit designer added flexibility when laying out a circuit design as the TFETs themselves can be angled as needed. Additionally, embodiments such as TFETs 402, 404, and 406, and others may be rotated to a desired orientation.

The embodiments of TFETs 402, 404, and 406 may also be described in terms of the orientations of the generally rectangular drain region 204 and the generally rectangular transistor gate 208. The orientation of each generally rectangular feature being determined by its longer side. In such terms, TFET 402 is a TFET in which the orientations of drain region 204 and transistor gate 208 are co-linear and transistor gate 208 significantly overlaps drain region 204. And in these terms, TFETs 404 and 406 are TFETs in which drain region 204 and transistor gate 208 are oriented are a right angle to each other. Thus any embodiments in which drain region 204 and transistor gate 208 are oriented at any angle relative to each other, and have coaxial out-of-plane features (the raised portion of drain region 204 and the gating surface of gate 208) may be within the scope of this disclosure.

Figure 5A:
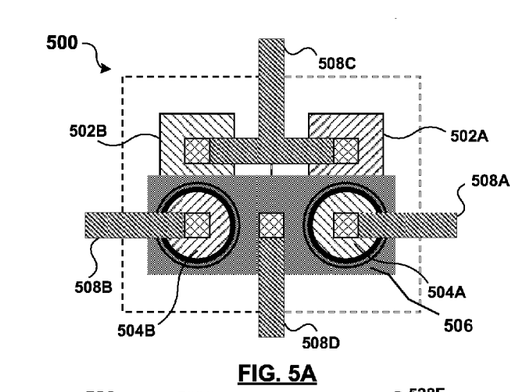
FIGS. 5A-C depicts top, schematic views of semiconductor device embodiments that include an inverter, a NAND gate, and a NOR gate.
Figure 5B:
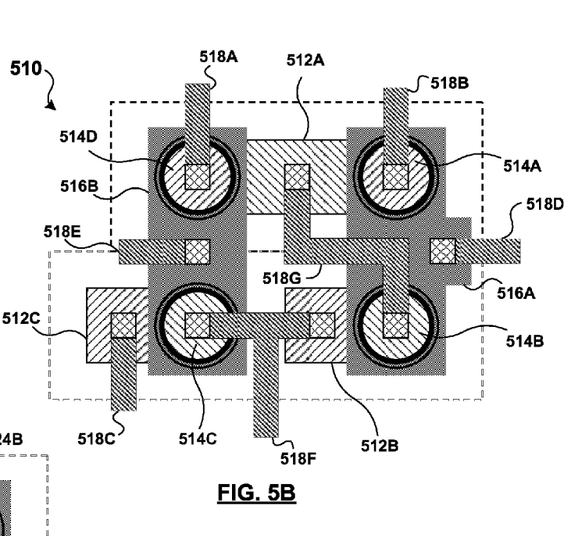
Figure 5C:
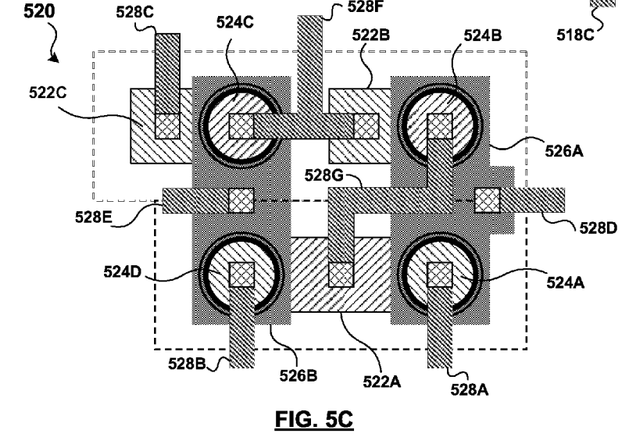

FIGS. 5A-C depicts schematic, top views of three embodiments that incorporate a number of TFETs similar to TFETs 200 and 300. For instance, FIG. 5A depicts a semiconductor device embodiment that is an inverter 500. The depicted embodiment of inverter 500 includes two drain regions: N-type drain region 502A and P-type drain region 502B. Inverter 500 also includes two source regions: P-type source region 504A and N-type source region 504B. These source and drain regions are connected by a single transistor gate 506, which has a single planar surface for contacting and two gating surfaces, each surrounding the frustoconical protrusions and overlapping the drain regions on the bottom and the source regions on the top as described above. It is understood that in between transistor gate 506 and the source and drain regions is a dielectric layer as explain above.

A plurality of leads is depicted as connected to the source contacts, the drain contacts, and the transistor gate contact. Leads 508A and 508B can be connected to a supply voltage or ground. In the depicted embodiment, lead 508B is connected to $V_{DD}$. Inverter 500 generates an output on lead 508C that is the inversion of the input signal received on lead 508D. Additionally, inverter 500 includes two wells: an N-type well surrounding P-type drain region 502B, and a P-type well surrounding N-type drain region 502A. While not depicted in this example, inverter 500 may also include an STI feature underneath the planar portion of shared transistor gate 506, which aid in electrically isolating drain regions 502A and 502B from each other.

FIG. 5B depicts a semiconductor device that is a NAND gate 510. NAND gate 510 includes four TFETS: two P-type TFETs and two N-type TFETs. NAND gate 510 has three drain regions: P-type drain region 512A is a shared drain region for two P-type TFETs, and two unshared N-type drain regions 512B and 512C. P-type drain region 512A is in an N-type well, while N-type drain regions 512B and 512C are in a P-type well. A first shared transistor gate 516A is connected to P-type drain region 512A and N-type drain region 512B and also to N-type source region 514A and P-type source region 514B. Similarly, a second shared transistor gate 516B is connected to P-type drain region 512A and N-type drain region 512C and also to N-type source region 514D and P-type source region 514C. While not depicted, an STI feature may be located underneath one or both of the first and second shared transistor gates.

As depicted, NAND gate 510 also includes a number of leads. In operation, leads 518A and 518B are connected to a supply voltage, $V_{DD}$, while 518C is connected to ground. Leads 518D and 518E receive input signals for NAND gate 510, which outputs to lead 518F. Lead 518F also connects source 514C to drain 512B, and lead 518G connects drain 512A to source 514B. It should be noted that care must be taken to prevent any lead from shorting to another lead. This may be done by placement of the leads on a single layer or one multiple layers. Thus, four TFETs may be connected together to form a NAND gate.

FIG. 5C depicts a semiconductor device that is a NOR gate 520. Like NAND gate 510, NOR gate 520 includes three drain regions: N-type drain region 522A and two P-type drain regions 522B and 522C. N-type drain region 522A is in a P-type well, while P-type drain regions 522B and 522C are in an N-type well. NOR gate 520 further includes four source regions, which are part of the four TFETs that form NOR 520. Source regions 524A and 524D are both P-type source regions, while source regions 524B and 524C are both N-type source regions. A first shared transistor gate 526A connects to drain 522A and source 524A on one side, and to 522B and 524B on the other. A second shared transistor gate 526B is connected to source region 524C and drain region 522C on one side and source region 524D and drain region 522A on the other side. While not depicted, an STI feature may be located underneath one or both of the first and second shared transistor gates.

A number of leads is also depicted in NOR gate 520. In operation, leads 528A and 528B are connected to ground, while 528C is connected to a supply voltage, $V_{DD}$. Leads 528D and 528E receive input signals for NOR gate 520, which outputs to lead 528F. Lead 528F also connects source 524C to drain 522B. Additionally, lead 528G connects drain 522A to source 524B. It should be noted that care must be taken to prevent any lead from shorting to another lead. This may be done by placement of the leads on a single layer or one multiple layers. Thus, four TFETs may be connected together to form a NOR gate.

In both NAND gate 510 and NOR gate 520, the transistor gate contacts for transistor gates 516A and 526A are depicted as forming an angle with the other source and drain contacts that is greater than 90 degrees. In other embodiments, the transistor gate contact may be centered within the dimensions of the transistor gate such that a 90 degree angle is formed. In such embodiments, some of the leads, such as 518G and 528G, may be rerouted, or additional metal layers may be used to provide access to the drains, sources, and gates.

Figure 6:
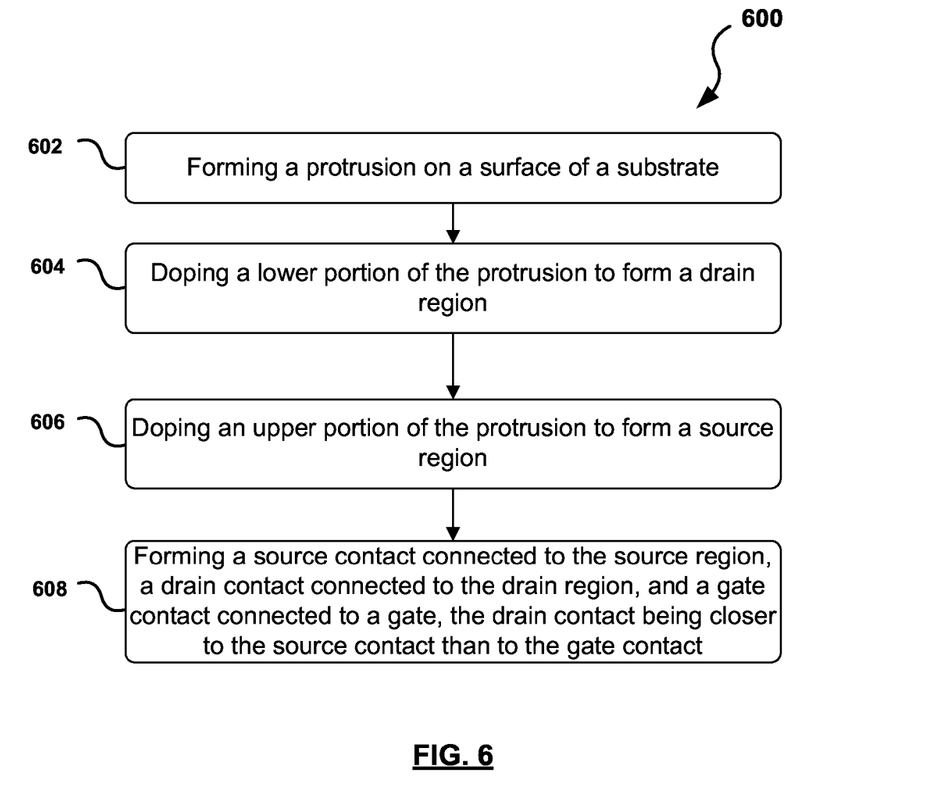
FIG. 6 is a flowchart of a method for fabricating a tunneling field effect transistor according to an embodiment.

FIG. 6 is a flowchart of a method 600 for forming a FET in which a drain contact is closer to a source contact than a gate contact. Method 600 begins in step 602 when a protrusion is formed on a surface of a substrate. For example, a hard mask layer of SiN may be deposited on the surface of the substrate and etched to form a circle around 100 nm in diameter. Etching the underlying silicon substrate will form a frustoconical protrusion that may range from 50 to 100 nm in height. Method 600 continues in step 604 when dopants are implanted into a lower portion of the protrusion. In this example, this may be done by implanting the dopants adjacent to the frustoconical protrusion and using a rapid thermal annealing (RTA) process to diffuse and activate the dopants. The RTA can diffuse the dopants laterally, so they extend underneath the protrusion, and also vertically, so the dopants that form the drain region move upward into the protrusion. Thus, the drain region may extend from the surface of the substrate into the lower portion of the protrusion. In the example, the implanted dopants are phosphorous dopants, while in other embodiments, the dopants may be P-type dopants, such as boron, or other N-type dopants such as arsenic.

In step 606, dopants are implanted into an upper portion of the protrusion to form the source region. In the example, boron is implanted into the top of the protrusion to create a P-type source region. The dopants are activated with a laser spike annealing process to create an abrupt source/channel interface. In embodiments where the drain region is a P-type drain region, the source region may be doped with N-type dopants. In step 608, a source contact, a drain contact, and a gate contact are formed. The source contact allows an electrical connection to the made to the source region; the drain contact allows an electrical connection to be made to the drain region, and the gate contact allows an electrical connection to be made to the transistor gate. The contacts are formed so that the drain contact is closer to the source contact than to the gate contact. Some embodiments of method 600 produce a tunneling field-effect transistor that is vertically configured.

In the example, a mask with at least three openings is applied to an oxide layer covering the source and drain regions and the gate. After etching the wafer, the three holes are filled with electrically conductive tungsten to form the source, drain, and gate contacts. The contacts are formed to match the arrangement of the source region, the drain region, and the gate. The contacts in the example, like that of FIG. 2A, are formed in a co-linear arrangement, such that the three contacts are in line with the drain contact on one side of the source contact, and the gate contact is opposite the drain contact. In other embodiments, the underlying FET structure may be such that the contacts are not formed in a co-linear arrangement, but in another arrangement. Such would be the case where the drain region and the planar surface of the transistor gate are oriented relative to each other at a 90 degree angle as described in connection with FIGS. 4A and 4B above. So one alternative embodiment includes the three contacts forming a right angle, with the source contact at the vertex of the angle. Other embodiments in which the drain contact is closer to the source contact than to the gate contact are within the scope of this disclosure.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a field effect transistor (FET), the method comprising:
   forming a protrusion on a surface of a substrate;
   doping a lower portion of the protrusion and a portion of the substrate with a first dopant to form a drain region of a transistor, wherein the drain region extends beyond the protrusion in a first direction and a second direction opposite the first direction;
   doping an upper portion of the protrusion with a second dopant to form a source region of the transistor, wherein the first and second dopants are of opposite types;
   forming a transistor gate to have a planar portion and a gating surface,
      wherein the gating surface surrounds a portion of the protrusion between the lower and upper portions of the protrusion,
      wherein the planar portion is parallel to the surface of the substrate and located directly above the doped portion of the substrate and directly above a trench isolation feature disposed within the substrate, the trench isolation feature extending into a region of the substrate below the drain region, and
      wherein an oxide layer is disposed between a gate dielectric of the planar portion and the trench isolation feature and further between the gate dielectric of the planar portion and the doped portion of the substrate; and
   forming a source contact connected to the source region, a drain contact connected to the drain region, and a gate contact connected to the planar portion of the transistor gate, the drain contact being closer to the source contact than to the gate contact.

2. The method of claim 1, wherein forming the source contact further comprises:
   etching a plurality of openings in an insulating layer, a first of the openings allowing contact to a drain region, a second of the openings allowing contact to a source region, and a third of the openings allowing contact to a transistor gate; and
   filling the first, second, and third of the openings with a conducting material.

3. The method of claim 1, wherein forming the source contact, the drain contact, and the gate contact comprises forming the source contact, the drain contact, and the gate contact in a co-linear arrangement.

4. The method of claim 1, wherein forming the source contact, the drain contact, and the gate contact comprises forming the source contact, the drain contact, and the gate contact in a right-angled arrangement.

5. The method of claim 1, wherein the doping of the lower portion of the protrusion comprises:
   doping an area of the substrate with the first dopant, the area of the substrate being adjacent to the protrusion; and
   diffusing the first dopant such that some of the first dopant move laterally under the protrusion and vertically into the protrusion.

6. The method of claim 1, further comprising, before the forming of the transistor gate:
   forming the oxide layer over the trench isolation feature of the substrate, wherein the transistor gate is subsequently formed over the oxide layer.

7. A semiconductor device comprising:
   a protrusion formed over a substrate;
   a drain region formed over the substrate, wherein the drain region includes a lower portion of the protrusion and a doped portion of the substrate that extends beyond the protrusion in a first direction and a second direction opposite the first direction, and wherein the doped portion of the substrate that extends in the first direction is contacted by a drain contact;
   a source region formed in an upper portion of the protrusion, wherein the source region is contacted by a source contact, and the source region and the drain region have opposite types of dopants;
   a channel region formed between the lower and upper portions of the protrusion; and
   a transistor gate having a gating surface and a planar portion,
      wherein the gating surface surrounds the channel region,
      wherein the planar portion is located directly above the doped portion of the substrate that extends in the second direction and directly above a trench isolation feature within the substrate, the trench isolation feature extending into a region of the substrate below the drain region,
      wherein an oxide layer is disposed between a gate dielectric of the planar portion and the trench isolation feature, wherein the planar portion is contacted by a gate contact, and wherein, from a top view, the drain contact is closer to the source contact than to the gate contact.

8. The semiconductor device of claim 7, wherein the oxide layer is further disposed between the doped portion of the substrate that extends in the second direction and the planar portion.

9. The semiconductor device of claim 7, wherein the drain contact, the source contact, and gate contact are arranged co-linearly from the top view.

10. The semiconductor device of claim 7, wherein:
the source contact and the drain contact are arranged along a first line from the top view;
the gate contact and the source contact are arranged along a second line from the top view; and
the first and second lines form a right angle.

11. The semiconductor device of claim 7, wherein:
the drain region is generally rectangular from the top view;
the transistor gate is generally rectangular from the top view; and
the drain region and the transistor gate are arranged co-linearly from the top view.

12. The semiconductor device of claim 7, wherein the source region, drain region, and transistor gate form a tunneling field effect transistor in which the gating surface overlaps a portion of the source region and a portion of the drain region.

13. A semiconductor device comprising:
a first tunneling field effect transistor (TFET) and a second TFET formed over a substrate, wherein the first and second TFETs further includes, respectively:
a protrusion formed over the substrate;
a drain region formed over the substrate, wherein the drain region includes a planar drain portion and a raised drain portion, the raised drain portion is a lower portion of the protrusion, and the planar drain portion further comprises a first portion and a second portion that each extend beyond the raised drain portion, wherein the first portion is contacted by a drain contact;
a source region formed in an upper portion of the protrusion, wherein the source region and the drain region have opposite types of dopants and the source region is contacted by a source contact; and
a transistor gate with a planar gate portion and a gating surface, the gating surface surrounding both a portion of the source region and a portion of the raised drain portion, and
wherein the planar gate portion of the first TFET and the planar gate portion of the second TFET are formed from a single planar structure, and the single planar structure is contacted by a gate contact and is located directly above a trench isolation feature within the substrate and further directly above the second portion of the planar drain portion with an oxide layer, the trench isolation feature extending into a region of the substrate below the drain region, and wherein the oxide layer is disposed between a gate dielectric of the planar drain portion and the trench isolation feature.

14. The semiconductor device of claim 13, wherein the drain region of the first TFET and the drain region of the second TFET have opposite types of dopants.

15. The semiconductor device of claim 13, wherein the gate contact, the source contact of the first TFET, and the source contact of the second TFET are arranged along a first line from a top view.

16. The semiconductor device of claim 15, wherein:
the drain contact of the first TFET and the drain contact of the second TFET are arranged along a second line from the top view; and
the first and second lines are in parallel.

17. The semiconductor device of claim 13, wherein:
the planar drain portion of the first TFET and the planar drain portion of the second TFET are each generally rectangular from a top view, are arranged side by side along their longer sides, and are spaced away from each other.

18. The semiconductor device of claim 13, wherein:
the single planar structure overlaps the planar drain portion of the first TFET from a top view, leaving a first portion of the planar drain portion of the first TFET visible from the top view;
the single planar structure overlaps the planar drain portion of the second TFET from the top view, leaving a second portion of the planar drain portion of the second TFET visible from the top view; and
the first portion and the second portion are disposed on same side of the single planar structure from the top view.

19. The semiconductor device of claim 13, wherein:
the single planar structure overlaps the planar drain portion of the first TFET from a top view, leaving a first portion of the planar drain portion of the first TFET visible from the top view;
the single planar structure overlaps the planar drain portion of the second TFET from the top view, leaving a second portion of the planar drain portion of the second TFET visible from the top view; and
the first portion and the second portion are disposed on opposite sides of the single planar structure from the top view.

20. The semiconductor device of claim 13, wherein:
the trench isolation feature is formed between the drain region of the first TFET and the drain region of the second TFET.

* * * * *